US005902634A

United States Patent [19]

Maschwitz et al.

[11] Patent Number: 5,902,634
[45] Date of Patent: May 11, 1999

[54] PERMEABLE SOLAR CONTROL FILM

[75] Inventors: Peter A. Maschwitz, Martinsville; Jonathan S. Payne, Collinsville; Paul A. Diffendaffer, Bassett, all of Va.

[73] Assignee: Courtaulds Performance Films, Martinsville, Va.

[21] Appl. No.: 08/586,312

[22] Filed: Jan. 17, 1996

[51] Int. Cl.$^6$ ...................................................... B05D 5/06
[52] U.S. Cl. .................. 427/162; 427/164; 427/248.1; 427/250; 427/255.7; 427/409; 427/419.2; 427/419.3
[58] Field of Search ........................ 427/162, 166, 427/248.1, 250, 409, 414.2, 414.6, 255, 255.7, 164

[56] References Cited

U.S. PATENT DOCUMENTS

| Re. 28,883 | 6/1976 | Willdorf ............................... 156/71 |
|---|---|---|
| 3,290,203 | 12/1966 | Antonson et al. . |
| 3,398,040 | 8/1968 | Allen et al. . |
| 3,927,228 | 12/1975 | Pulker .................................... 427/162 |
| 4,048,039 | 9/1977 | Daxinger ............................. 204/192 P |
| 4,161,547 | 7/1979 | Kienel .................................... 427/164 |
| 4,161,560 | 7/1979 | Kienel .................................... 427/164 |
| 4,252,843 | 2/1981 | Dorer et al. ........................... 427/162 |
| 4,321,299 | 3/1982 | Frazer .................................... 428/247 |
| 4,462,883 | 7/1984 | Hurt ..................................... 204/192 C |
| 4,578,310 | 3/1986 | Hatfield .................................. 428/334 |
| 4,599,272 | 7/1986 | Ichiwara ................................ 427/164 |
| 4,759,950 | 7/1988 | Stevens ................................... 427/252 |
| 4,789,563 | 12/1988 | Stevens ................................... 427/252 |
| 4,959,243 | 9/1990 | Steininger ............................ 427/164 |
| 4,965,121 | 10/1990 | Young et al. ........................ 428/213 |
| 4,971,863 | 11/1990 | Hart ..................................... 428/458 |
| 5,218,472 | 6/1993 | Jozefowicz et al. ................. 359/584 |
| 5,377,045 | 12/1994 | Wolfe ................................... 427/166 |

FOREIGN PATENT DOCUMENTS

WO 94/04356  3/1994  WIPO .

OTHER PUBLICATIONS

Porous Flouride Antireflective Coatings, Ian M. Thomas, *Applied Optics*, vol. 27, No. 16, Aug. 15, 1988, pp. 3356–3358.

Effect of Substrate Surface Roughness on the Columnar Growth of Cu Films, P. Bai et al., J. Vac. Sci., Technol. A9(4), Jul./Aug. 1991, pp. 2113–2117.

*Primary Examiner*—Janyce Bell
*Attorney, Agent, or Firm*—Bacon & Thomas

[57] ABSTRACT

The present invention provides an improved method for making a solar control sheet having one or more metal layers. In the prior art solar control sheets, each metal layer would normally be non-porous so that water vapor would not be readily transmitted therethrough. However, in this invention the metal layer is rendered porous because it is deposited on a porosity inducing surface. The porosity inducing surface may be the surface of a porous primer layer or a surface which has been roughened. Consequently when the solar control film of this invention is mounted on a window with a water based mounting media, the water can quickly evaporate through the film without causing undesirable cloudiness which is normally associated with water which becomes trapped between the film and the window.

24 Claims, 5 Drawing Sheets

PERMEABLE SOLAR CONTROL FILM

BACKGROUND OF THE INVENTION

1. Field of the Invention

The present invention relates to flexible energy control sheets and assemblies which include at least one optical, thin film, coating layer for spectral control and which have enhanced water vapor permeability.

2. Background Information

For the past few decades, flexible solar control sheets have been in use to improve the energy transmission, and appearance of transparent glazing used in commercial buildings, residential buildings and vehicles. This invention relates to solar control sheets that are retrofitted to already installed transparent glazing surfaces, or laminated to a glass or other glazing material surface as part of the original assembly of a glazing product. In this second case, a solar control sheet is installed on a transparent glazing surface as part of a fenestration manufacturing process before the window is installed in a building or vehicle.

The purpose for using these flexible energy control sheets is to alter the solar energy transmission, reflection, absorption, and emission of glazing. The most common function is to reduce solar heat gain thereby improving comfort and reducing cooling load within an architectural or transportation structure. Some energy control sheets are designed so that the surface of the sheet facing away from the rigid glazing to which the sheet is attached has high thermal infrared reflectivity. Such low emissivity sheets reduce thermal energy loss through glazing and contribute to reduction of heating energy requirements when outdoor temperatures are below indoor temperatures in a building or vehicle. Alteration of the visible, and infrared spectral characteristics of glazing is primarily done with optical thin film coatings. Although many alternative designs exist, the most commonly used optical thin film structures in solar control sheets may be categorized into three basic types. The simplest sheets reduce light transmission evenly in the visible and infrared wavelengths. These sheets are not considered spectrally selective, and usually contain one thin film layer consisting of an optically neutral nickel alloy. The second type of solar control sheet uses an infrared reflecting metal such as aluminum, copper or silver as its thin film layer and the reflection level in the infrared wavelengths is increased in these sheets making them somewhat spectrally selective. The third type of solar control sheet also contains infrared reflecting metals but makes use of thin optical interference layers as well. The optical interference layers are usually nonabsorbing or slightly absorbing dielectric layers. The interference layers antireflect the metals and result in solar control sheets with high visible transmission, high infrared reflectance, low visible reflectance, and low infrared transmission. Some combinations of infrared reflecting metals and interference layers result in sheets with high spectral selectivity. This invention concerns flexible solar control sheets which contain such thin film layers and are attached to a surface of rigid transparent glazing by an adhesive.

For purposes of optical clarity, solar control sheets must be attached to the surface of a rigid transparent glazing material such as glass with no trapped air or other sources of optical distortion. Except in certain manufacturing environments where a sheet can be rolled onto a glass surface with precision equipment, dry adhesive cannot be attached to dry glass without incorporating air. Particularly when applied to already installed glazing, proper positioning of a solar control sheet on a glazing surface is a problem due to the tendency for instantaneous sticking of adhesive to glass. The two problems of air entrapment and positioning are solved by the addition of water or a dilute solution of water and surfactant between the solar control sheet's adhesive and the glass surface. With the presence of this aqueous solution acting as a lubricant and spacer, positioning of the sheet and subsequent squeezing out of trapped air is relatively easy. Once all positioning and air removal is complete, squeezing or squeegeeing of residual solution out from between solar control sheet and glass is done until as much liquid is removed by this technique as possible. Complete removal of water and surfactant is not possible by this squeezing process. Some residual solution always remains between the solar control sheet and the rigid glazing surface.

The result of this water aided attachment process and its leftover layer of aqueous solution is not without negative consequences to the solar control sheet. The water portion of the remaining solution diffuses into the materials from which the solar control sheet is assembled and, if it remains too long in this assembly, causes undesirable chemical changes. The most immediate change is the formation of a two phase mixture of water and adhesive polymer in the adhesive layers that are part of the solar control sheet assembly. This two phase mixture causes the scattering of visible light which gives the sheet a milky translucent appearance. Solar control sheets applied to glazing and that retain water for more than approximately six hours will form the mixtures of adhesive and water. Although not permanent, the initial formation and duration of this milky appearance is dependent on the overall water vapor permeability of the solar control sheet. If water diffuses through and evaporates from the solar control sheet within a few hours and before the mixture of adhesive and water has time to form, the milky appearance will not occur. Solar control sheets that dry within this few hour period under ambient conditions that are not unusually cold and humid (<5° C. and >70% relative humidity), are hereafter referred to as "rapid drying" or "water permeable".

Other problems, as a consequence of the residual, aqueous, surfactant solution, are corrosion of metal thin film layers within the solar control sheet assembly and optical distortion of the adhesive layer in contact with the rigid glazing surface. Corrosion of the metal layers occurs from the water contained within the assembly acting as an electrolyte and causing galvanic chemical activity. The metal layers present for spectral control are less than 100 nanometers thick and even small amounts of galvanic chemical activity will destroy their intended optical function. Optical distortion within the attachment adhesive layer is cause by coalescence of the residual solution into pools between the adhesive and rigid glazing. These pools appear exactly like water filled blisters and as long as they are present they distort the optical clarity of the solar control sheet. Often these blisters, if present for days without drying out, will create permanent deformities in the adhesive and subsequent undesirable permanent optical distortion in the solar control sheet. The occurrence of both corrosion of the metal layers and adhesive distortion are related to the overall water vapor permeability of the solar control sheet.

Water vapor permeability of the various components of the solar control sheet assembly are not equal. The polymer layers within this assembly which typically include polyethylene terephthalate sheets or other polymer sheets, adhesive layers, and hard polymer layers for abrasion resistance all have sufficient water vapor permeability to avoid the previously mentioned problems associated with residual attachment solution. If these were the only layers present in the solar control sheet, residual solution would diffuse through the film rapidly enough to cause no detrimental effects. Sufficiently rapid diffusion of water through and evaporation away from the sheet until water content equilibrium is reached with the ambient humidity, hereafter known as "drying", needs to occur within a few hours for none of the problems to occur, especially for the milky appearance.

The optical thin film layers deposited upon the polymer sheets within the solar control sheet assembly, minus some exceptions to be noted, do not share the same degree of water vapor permeability as the polymer layers. Most vacuum deposited thin film layers typically used for spectral control are excellent barriers to diffusion of water vapor. These thin film layers are the water vapor diffusion rate determining segment of a solar control sheet and it is the permeability of these layers that is the focus of this invention.

Solar control sheets that are water vapor permeable and therefore non-clouding, non-blistering and less prone to corrosion are more commercially viable than those that are water impermeable. A large part of the market for solar control sheets is application to automotive glazing. For safety reasons and to achieve a pleasing appearance, it is important for solar control sheets applied to automotive glazing to exhibit no clouding or distortion when they are applied. Water permeability related problems causing poor optical clarity of a solar control sheet in the automotive market will severely limit its salability.

For solar control sheets applied to the architectural glazing market, the water permeability related problems are not a safety hazard as in the automotive market but will still substantially limit the salability. Distortion and cloudiness lasting more than a day or two are generally considered unacceptable in a solar control sheet applied to residential or commercial buildings. When solar control sheets are applied to glazing as part of a window manufacturing process, they are usually applied to the one of the internal surfaces of a dual pane insulating glass unit. Inclusion of water vapor within the internal gas space in an insulating glass unit will cause condensation formation for the life of the unit which is considered unacceptable in the industry. Therefore, before the two glass panes and the gas space are sealed, the solar control sheet must be thoroughly dried. Drying an impermeable solar control sheet is expensive due to the time required and would not be salable to this manufacturing market.

As noted above, solar control sheets which have sufficient water permeability for rapid drying are highly desirable in the technological field to which this invention applies. Also noted is the fact that of all the layers within the solar control sheet assembly, the vacuum deposited thin film layers are the water permeability limiting portion. It is the physical structure of thin film layers that is the primary determinant of the rate at which water may pass through a solar control sheet. Films formed of tightly compacted atoms or molecules are barriers to water passage. Films that have columnar or crystalline structures and having open spaces between columns or crystals are more permeable to water. The physical structure of these thin film layers varies depending on their deposition method, the materials from which they are formed and their thickness.

Vacuum deposition methods by which typical thin film solar control coatings are made are either thermal evaporation or direct current magnetron sputtering. These deposition processes are distinguished by how the individual atoms or molecules are separated from the source material and accelerated towards the substrate. In the process of thermal evaporation, the source material is heated until atoms or molecules leave its surface as vapor which recondenses on the substrate. In the sputtering process, kinetic energy of a positively charged ion accelerated towards the negatively biased source material (the sputtering target) transfers its energy to the atoms or molecules at the surface of the source material. This transfer of energy results in the chipping off of surface atoms or molecules. An important difference in these two deposition processes is the kinetic energy they impart to the depositing atoms and molecules. Atoms and molecules deposited with thermal evaporation carry low levels of kinetic energy (less than 1 electron volt) and are more likely to form thin films with open structures that are water permeable. Solar control sheets containing transparent layers of thermally evaporated aluminum or nickel are common and sufficiently water permeable to be considered rapid drying products.

The vacuum deposition method of direct current magnetron sputtering is the most commonly used process for forming thin film coatings of metals other than aluminum for solar control sheets and is characterized by the higher level of kinetic energy it imparts to the depositing atoms (1 to 10 electron volts). Depositing metal atoms carrying high kinetic energies are far more likely to form thin film layers with tight compact structures and are usually insufficiently water permeable to be considered fast drying. Neither transparent nickel or aluminum thin films are considered rapid drying in a solar control sheet when deposited by sputtering. The metals of gold, copper and silver and their alloys which have high infrared reflectivity and are necessary to produce spectrally selective, high visible transmission, low infrared transmission solar control sheets are typically deposited by direct current magnetron sputtering. They generally do not form water permeable films.

The commonly manufactured solar control sheets with neutral gray, nonspectrally selective optical characteristics have relatively similar reflectance and transmission characteristics across all of the ultraviolet, visible and infrared spectrum. The thin film metals used to produce the nonspectrally selective solar control sheets are typically titanium, chromium, iron, nickel, niobium, molybdenum, and alloys of these. The most common method of depositing these thin film metals for solar control sheets is direct current magnetron sputtering, and when deposited by sputtering, they generally are not water permeable.

In some solar control sheet products, it is desirable to achieve greater spectral selectivity than that exhibited by the neutral grey metal layers described above. Solar control sheets with visible transmission greater than 50%, visible reflectance less than 15%, infrared reflectance greater than 50%, and infrared transmission less than 15% are useful in the marketplace due to their potential for improving the energy efficiency of architectural or automotive windows. The spectral selectivity is typically achieved by alternating thin film layers consisting of infrared reflecting metals and dielectric optical interference layers. The metal layers usually consist of direct current magnetron sputtered silver, copper, gold or their alloys. The dielectric layers may be sputtered or thermally evaporated, and their effect is designed to reduce reflectance and raise transmission of the metals in the visible wavelengths. These multilayer spectrally selective films are particularly impermeable to water.

Thermal evaporation can be accomplished by a few different methods. For nonmetallic materials with low vapor pressures such as titanium dioxide, electron beam evaporation is sometimes used. In the electron beam process, a beam of electrons is aimed directly at the evaporant held in a high temperature crucible. Temperatures high enough to evaporate virtually any material can be reached by this technique. When oxides or other compounds are evaporated, the atoms in the molecular structure of the compound are often dissociated due to the extreme heat. For example, when $TiO_2$ is brought up to its vacuum vaporization temperature, some of the titanium and oxygen atoms separate and a portion of the released oxygen is pumped away by the vacuum pumps. Consequently, the coating is not stoichiometric $TiO_2$ but is instead a titanium rich compound which is optically absorbing. Vacuum coaters typically require clear (nonabsorbing) $TiO_2$ and compensate for the lost gas by adding extra oxygen into the chamber during the coating process. However, in other technological fields which provide a metal oxide coating, such as the technological field relating to the manufacture of heat mirrors on lenses, glass and small polymer substrates, it is important to carefully control the amount of extra oxygen added during the coating process because if too much oxygen is added, the deposited titanium dioxide becomes porous. Porosity in these other technological fields is undesirable and precautions are used to prevent its occurrence so as to keep the deposition clear but not porous.

Such porous coatings in these other technological fields have never been associated with any method of making a porous metal coating on a substrate especially a thin film substrate for retrofit application on windows and consequently no one has ever used such coatings to produce a porosity inducing surface for inducing porosity of materials, such as metals, which are coated on solar control sheets. This is not surprising in view of the undesirability of porosity in these other technological fields.

As noted above, it is known in other technological fields to make heat mirrors on lenses, glass and small polymer substrates which include a thin film structure having the layers $TiO_2/Ag/TiO_2$ wherein $TiO_2$ serves as a dielectric layer. Many other dielectrics are used also for heat mirrors on lenses, glass, and small polymer substrates. Other typically used dielectrics include ZnO, ZnS, $Nb_2O_5$, $SnO_2$, $Ta_2O_5$, or $In_2O_3$. Occasionally the process produces poor quality porous stacks. However, practitioners in these other technological fields never attributed such porosity with any specific characteristics of a layer upon which another material is deposited. Thus the undesirable porosity of such a stack could be attributed to other factors, such as the thickness of the layers or coating conditions for the metal layer rather than to the selection of physical characteristics of a layer upon which other layers are deposited. In any event, practitioners in these other technological fields never regulated the porosity of a primer layer in order to achieve porosity in a subsequently applied metal layer nor would they find it desirable to do so. Thus, it was never apparent to such practitioners that a porous metal coating could be obtained through the use of a process which employs a metal coating step conducted under conditions which would normally produce a non-porous coating but for the selection of a primer layer having certain porosity inducing characteristics.

Resistance evaporation is another commonly used evaporation technique to provide a coating on an article. This process is similar to electron beam evaporation except electric current flowing through a heating element is used as the heat source to evaporate the coating material. This process also requires the addition of extra oxygen to the chamber for the same reasons noted above with respect to the electron beam evaporation coating. Resistive evaporation techniques as used in other technological fields typically require careful control of the oxygen content to keep the deposition clear but not porous. In other technological fields, e-beam and resistive evaporation are used for thousands of different types of coatings. Most of these coatings require careful control of oxygen to minimize porosity and absorption. Consequently, the same statements discussed above regarding electron beam evaporative coating are applicable to resistance evaporative coating techniques.

In other technological fields, porosity is considered detrimental. For example, it is known in the glass industry that a reactively sputtered zinc oxide coating can be made by sputtering a zinc target in a sputtering gas (e.g. argon) containing sufficient oxygen so that the entire surface of the zinc target is converted to the oxidized state. Under these conditions the properties of the deposited coating changes dramatically since the active portion of the sputtering target, its surface, is no longer metallic but is the metal oxide. For most sputtered materials, as the target surface goes from metal to oxide, the coating also goes from metal to oxide and usually both are relatively impermeable to water vapor. For some materials, as the chemical transition from metal to oxide occurs, so does the structural transition from nonporous (impermeable to water vapor) to porous. Materials which are known to follow this pattern are zirconium and zinc.

Metal oxides or other compounds which may be used in solar control sheets are more complex with regard to thin film structure and water permeability characteristics. Metal oxides and other chemical compound thin films generally follow the same rule of permeable structure as metals; that is the higher the kinetic energy of the atoms the tighter the film structure. For metal oxides and other compounds, however, there are other factors which can dictate whether the thin film structures are water permeable or impermeable. The most important of these factors is the makeup and pressure of the background gas as the films are deposited in the vacuum chamber. High background pressures of reactive gas, particularly amounts in excess of that which is required to produce a stoichiometric compound will result in thin films with open permeable structures. In fact, one embodiment of this invention makes use of excess amounts of reactive gases such as oxygen to produce thin films with specific degrees of openness in their structure.

Table 1 compares the water permeability of optically transparent, thin films deposited on a polyethylene terephthalate sheet substrate.

TABLE 1

| Water Permeable Thin Films | Water Impermeable Thin Films |
|---|---|
| evaporated aluminum | sputtered aluminum |
| evaporated nickel | sputtered nickel |
|  | sputtered silver |
| evaporated oxides | sputtered copper |
| some oxides sputtered in excess oxygen | most reactively sputtered oxides without excess oxygen |
| nickel alloys sputtered in argon pressures between 40 and 60 microns of mercury | |

The water permeability of solar control sheets is measured in terms of a water vapor transmission rate (WVR). The units of measurement are usually grams/square meter/day. Generally, if the WVTR of a solar control sheet is 2 grams/square meter/day or more, drying time is sufficiently short as to avoid cloudiness caused by entrapment of water between the film and the glass. Therefore, solar control sheets which have a WVTR of at least 2 grams/square meter/day are considered as being sufficiently water permeable to be considered rapid drying in this invention. Those which have a WVTR less than 2 grams/square meter/day are considered as being water impermeable in this invention and are not considered fast drying. A typical solar control sheet assembly as shown in FIG. 1 consisting of a glazing attachment adhesive, a 12 micron thick UV absorbing polyester (polyethylene terephthalate) sheet, a laminating adhesive, a 25 micron polyester sheet, and a 1 micron acrylic abrasion resistant coating but no thin film layers to limit water permeability, have a WVTR of approximately 20 grams/ square meter/day. The same solar control sheet assembly described above but containing vacuum deposited thin film layers may have a WVTR from 0.1 to 20 grams/square meter/day. The thin film layers in solar control sheet assemblies are the component that determines whether a sheet is to be rapid drying or not.

Conventional devices known to those skilled in the art may be used to measure the water permeability of a solar control sheet. One such device used to measure permeability, commonly referred to as a "mocon", is commercially available from Modern Controls Inc., 6820 Shingle Creek Parkway, Minneapolis, Minn., 55430. The water vapor transmission rates described in relation to this invention are obtained by operating the instrument in accordance with ASTM test procedure F372-73 (reapproved 1984)$^{e2}$. The instrument uses a removable diffusion cell having upper and lower halves. In operation, test samples of a sheet are cut into pieces about 4 inches by 4 inches (10 cm×10 cm). The sample sheet is mounted between the upper and lower halves of a removable diffusion cell so as to form a divider between two enclosed chambers (upper and lower halves). The lower volume of the assembled cell block contains pads moistened with distilled water or saturated salt solution (NaCl). The upper volume is vented through two openings that permit a constant flow of dry air to pass across one side of the film. The mating internal surfaces of the diffusion cell define an area of 50 square centimeters.

The test sheet mounted in the diffusion cell is clamped into the test chamber. When inserted, the sheet is exposed to a continuous flow of dry air across the upper side while the bottom side is exposed to water vapor from the moistened pads in the humid cavity. Gas leaving the dry cavity via the exhaust port consist of a mixture of air and water vapor in a ratio determined by the dry air purge rate and the rate of moisture transmission through the sheet barrier. Thus, it can be easily understood that if the flow rate of dry air into the cell is maintained at some arbitrary constant value, the resulting water vapor density in the exhaust line will be determined by the sheet water vapor transmission rate.

The water vapor concentration of the diffusion cell exhaust flow is monitored by an infrared detector. Over the concentration range of interest, the detector output displayed by the digital meter is a linear function of the transmission rate of moisture through the sheet.

Three approaches are available for overcoming the above noted clouding problem of solar control sheets in this technological field. In one approach, the use of water in the mounting process could be eliminated. However, the water serves to promote slip during the mounting process so that the film can be readily positioned on the window, and the water serves to facilitate the removal of trapped air bubbles. Thus, use of the water to solve the clouding problem will create extreme application difficulties. At this time there is no known way to apply solar control sheets to existing glazing without the use of an aqueous solution.

Another approach could involve using non-clouding adhesives. This technology is presently practiced in the industry by some participants to reduce the clouding problem. However, this does not solve the other problems of corrosion of the metal thin film layers and optical distortion associated with long term entrapment of water. Thus, elimination of the non-clouding adhesives would not solve all the problems associated with the use of water as a mounting media.

Another approach involves substituting impermeable, thin film, optical layers with permeable layers which have the requisite permeability so that the water can rapidly diffuse through the film. As noted above, the number of permeable thin film layers is limited. Solar control sheets that are the most spectrally selective and exhibiting the most desirable optical properties generally make use of silver, copper, or gold metal layers. These metals cannot be made permeable through standard deposition techniques practiced today.

SUMMARY OF THE INVENTION

It is an object of this invention to provide a porous solar control sheet which includes porous structured thin film layers therein having sufficient permeability for the transmission of water vapor therethrough so that when the film is mounted on rigid glazing with a water based mounting media, residual water which is left between the film and the rigid glazing can readily escape by diffusion or transmission through the layers of the sheet.

It is a further object of this invention to provide a method for making a multiple layered solar control sheet having one or more porous water vapor transmissible thin film layers as a component thereof. The thin film layers are porous for the transmission of water vapor therethrough even though the thin film layers are deposited under conditions which would normally produce a water impermeable (non-water vapor transmissible) thin film layer. No special modifications to the thin film deposition process is necessary to achieve the desired permeability of the thin film layers and residual water left between the film and the glass can be dissipated by evaporation through the multi-layered solar control film.

It is a further object of this invention to provide a method of making porous copper, silver, and other infrared reflecting metal thin film coatings for a solar control sheet. It is a further object of this invention to provide a method of mounting a solar control film on a window with a water based mounting media while eliminating the formation of cloudiness, corrosion and distortion associated with water which becomes trapped between the film and the glass during the mounting procedure.

These and other objectives are accomplished by providing the polymer sheet substrate with a porosity inducing surface whereby the porosity inducing surface induces porosity in one or more layers sequentially deposited thereon. A porosity inducing surface may be formed by providing the polymer sheet with a porous primer layer having a porosity characteristic which permits vacuum deposition of a water permeable thin film layer or layers on the porous primer under coating conditions which would normally produce a water impermeable thin film if the coating were applied on a substrate which lacks the porous structure of the primer layer. In other words, the porous primer layer itself is selected for specific porosity characteristics so that no special porosity promoting or permeability promoting coating conditions are required for subsequent thin film layers which would normally be impermeable. Thus, permeable thin film layers can be deposited under conditions which would otherwise result in a water impermeable thin film but for the porous structure characteristics of the primer layer. A porous primer coating may cause one or more subsequent thin film layers to be water permeable. The porosity inducing surface may also be formed by providing the polymer sheet substrate with a roughened surface. Such a porosity inducing surface will induce porosity in a coating deposited thereon like the porosity inducing surface associated with a porous primer layer.

Although the primer layer must be porous to cause the subsequently applied thin film layers to become permeable, not all porous materials will cause subsequently applied layers to be permeable. Some materials, such as the typical polyethylene terephthalate sheets which are used as the substrate for thin film layers in conventional solar control sheets, are known to be water permeable, but the porous structure is not adequate to transfer to the subsequently applied thin film layers and cause them to also be permeable. Similarly, some vacuum deposited layers such as sputtered nickel alloys which are deposited under conditions which make the metal coating water permeable (water vapor transmissible) lack the required porosity characteristics which are necessary to cause a subsequently applied thin film layer to be permeable. Thus the porous primer layer must have a sufficient porosity to cause normally impermeable thin film layers to be permeable when sputtered thereon. In the case of oxides such as $SiO_2$ and $SnO_2$, which are the preferred primers, an adequate level of porosity may be achieved by using background oxygen during the evaporative deposition. It has been observed that as the oxygen level increases, so does porosity of a thin film oxide. For example, it has been determined that using an oxygen partial pressure of 3 microns of mercury and 5 microns of mercury is adequate to achieve the required porosity for reactively evaporated $SnO_2$ and $SiO_2$ respectively and that increasing the amount of background oxygen beyond this amount will result in greater porosity.

In general, the pore size of a deposited primer layer should be greater than 1 nm in diameter. Pores larger than about 100 nm should be avoided because such large size pores will cause scattering of visible light resulting in a hazy appearance. This range of desirable pore size, 1 to 100 nanometers, also applies to layers deposited onto the porous primer that have porosity induced by the porous primer. Pore sizes are determined by surface analysis techniques such as scanning electron microscopy or transmission electron microscopy.

It has been observed that sputtered gold, silver, copper, palladium or their alloys will be porous when deposited onto a porous primer layer of ZnO. Preferably, the ZnO has a thickness of at least 2 nm when it has been deposited by reactive sputtering from a zinc metal target. In addition, when the ZnO is deposited in this manner, it is preferable to conduct the sputtering with excess background oxygen to enhance the porosity of the primer layer. Preferably an oxygen pressure of at least 25% to 50% over the amount needed to produce clear ZnO is used to provide the background oxygen during the reactive sputtering of the zinc metal target. ZnO deposited in this manner will be porous due to the columnar physical structure of the coating.

Stainless steels or nickel alloys will be porous when deposited onto a porous primer layer of $ZrO_2$. Preferably, the $ZrO_2$ has a thickness of at least 30 nm when it has been deposited by reactive sputtering from a Zr metal target. In addition, when the $ZrO_2$ is deposited in this manner, it is preferable to conduct the sputtering in the presence of background oxygen to enhance the porosity of the primer layer. Preferably, an oxygen partial pressure of at least 50% over the level needed to produce clear $ZrO_2$ is used to provide the background oxygen. $ZrO_2$ deposited in this manner is porous due to its columnar structure.

Almost any semi-transparent metal or compound layer including gold, silver, copper, palladium, nickel, iron, chromium, titanium, molybdenum, aluminum and alloys or multiple layers of these materials will be porous when deposited on a porous primer layer of $SnO_2$. Preferably, the $SnO_2$ has a thickness of at least 30 nm when it has been deposited by reactive evaporation of $SnO_2$. In addition, when the $SnO_2$ is deposited in this manner, it is preferable to conduct the reactive evaporation in the presence of background oxygen to enhance the porosity of the primer layer. Preferably, an oxygen partial pressure of 3 microns of mercury is used to provide the background oxygen. $SnO_2$ deposited in this manner is porous due to its columnar structure.

Stainless steels, nickel alloys and titanium will be porous when deposited onto a porous primer layer of $SiO_2$. Preferably, the $SiO_2$ has a thickness of 30 nm when it has been deposited by reactive evaporation of SiO. In addition, when the $SiO_2$ is deposited in this manner, it is preferable to conduct the reactive evaporation with background oxygen to enhance the porosity of the primer layer. Preferably, an oxygen partial pressure of 5 microns of mercury is used to provide the background oxygen. $SiO_2$ deposited in this manner is porous due to its columnar structure.

Instead of using the primer layer formed by the reactive evaporation of SiO, it is possible to obtain a suitable porous primer layer by applying a coating of $SiO_2$ sol gel to the desired substrate. Such a porous primer layer will have a sponge like porosity. Nickel alloy sputtered onto such a $SiO_2$ sol gel primer layer will have adequate porosity for this invention.

It has been observed that sputtered gold will be porous when deposited upon a polycarbonate substrate wherein the surface of the polycarbonate has been etched. The polycarbonate may be etched by any known procedure which creates a roughened or porosity inducing surface.

It has been observed that sputtered silver will be porous when deposited upon a porous primer layer of $TiO_2$. Preferably, the $TiO_2$ is deposited by reactive electron beam evaporation. Like the oxides described above, the $TiO_2$ primer layer may be deposited in the presence of background oxygen in order to enhance the porosity of the primer layer. $TiO_2$ deposited in this manner will be porous due to its columnar structure. For example, a suitable partial pressure of oxygen is 0.2 microns of mercury in order to form a porous $TiO_2$ primer layer. Sputter coating a layer of silver on such a porous $TiO_2$ primer layer results in the silver layer being water permeable. Sputtering this same layer of silver on a non-porous substrate will not result in the formation of a water permeable silver layer. The above procedure was used to form a 12 nm water permeable silver layer on top of a 40 nm layer of porous $TiO_2$.

The thin film layers such as the metals used in this invention may be made from any of the materials which are conventionally used in the field of solar control films. Thus, the alloys mentioned in this specification such as the nickel alloys used in some of the embodiments described herein may be the same as the nickel alloys which are conventionally used in solar control film technology. Preferred nickel alloys are Hastelloy C 276 and Inconel 600.

Hastelloy C 276 has the following mechanical properties: UTI tensil psi: 106,000; yield psi: 43,000; elong % 71.0. Hastelloy C 276 has the following chemical analysis:

| HASTELLOY C 276 | |
| --- | --- |
| element | % by weight |
| C | .004 |
| Fe | 5.31 |
| Mo | 15.42 |
| Mn | 0.48 |
| Co | 1.70 |
| Cr | 15.40 |
| Si | .02 |
| S | .004 |
| P | .005 |
| W | 3.39 |
| V | 0.16 |
| Ni | Balance |

Inconel 600 has the following mechanical properties: UTI tensil psi: 139,500; yield psi 60,900; elong % 44.0; hardness: Rb85. Inconel 600 has the following chemical analysis:

| INCONEL 600 | |
| --- | --- |
| element | % by weight |
| C | .08 |
| Fe | 8.38 |
| Ti | 0.25 |
| Mn | 0.21 |
| Cu | 0.20 |
| Co | 0.05 |
| Cr | 15.71 |
| Si | 0.30 |
| S | <.001 |
| Al | 0.28 |
| P | 0.01 |
| Ni | 74.45 |
| Nb + Ta | 0.08 |

The coatings are applied to films through the use of conventional film coating devices. Such a device is shown in FIG. 8. FIG. 8 shows schematically a vacuum roll coating apparatus 20. Apparatus 20 contains a chilled support drum 21 which carries a polyethylene terephthalate sheet in roll form 22. Uncoated sheet is supplied from pay-roll 23 and coated sheet is re-wound onto take-up 24. Subchamber shields 25 separate deposition sources 26, 27 and 28. Deposition sources 26 and 28 are DC magnetron sputtering sources and source 27 is a resistively heated box evaporation source with source material 29. Gas inlets 30 and 32 feed argon to the sputtering sources and gas inlet 31 feeds oxygen to the evaporation source. Gas exits through vacuum outlet 33.

A conventional resistively heated box evaporation source may be used for depositing the porous primer layer. A conventional resistively heated box evaporation source is shown in FIG. 9. The box is heated by passing electric current through the graphite box lid 34 and the graphite side heaters 39. Insulator 35 electrically isolates lid 34 from the graphite box 36. The box 36 contains the evaporant source material 40. Thermal insulating material 37 and water cooled outer shell 38 prevent lost heat from heating surrounding vacuum chamber walls. Source material vapor 41 is deposited on polymer sheet substrate 42 carried by cooled drum 43. Gas inlet 44 supplies oxygen background gas. Conventional evaporation sources may be used and such sources may be purchased from Leybold Technologies, Enfield, Conn. or from Galileo Vacuum Systems, East Granby, Conn.

The possible variations of material choices and deposition methods of porous primer layers are numerous. In its simplest application, a thin film structure requiring improved permeability may consist of only one layer, and the porous primer layer serves no other purpose than to make this single layer permeable. In this case, the single layer is usually a metal, and any suitable porous primer material may be chosen. It is known that not all combinations of primers and metals are interchangeable. DC magnetron sputtered nickel alloys can be made permeable by a layer of porous reactively evaporated $SiO_2$ while copper or silver metal layers do not become permeable when sputtered over this primer. The difference in response to a porous primer from one metal type to another is related to the physical properties and physical structure of the porous primer and metal layers.

This porous primer invention includes any layer or surface serving any purpose within a solar control thin film structure as long as it is also used to cause a desirable increase in water permeability of a thin film structure deposited on that layer or surface. Porous primer layers often serve only the one function to cause subsequent thin film layers to be permeable, but porous primers may also serve dual functions within the optical thin film structure. For example, a porous primer layer may also function as an optical interference layer, a corrosion protection layer, or a physical adhesion enhancement layer. Secondary optical functions for a porous primer layer are likely since porous primers often have the same optical properties as optical interference layers. It is only necessary to set the porous primer thickness to a specific level for it to serve some of the typical uses of an optical interference layer. The porous primer may serve to function for such purposes as an antireflection layer for a metal, the resonant cavity dielectric in a Fabry-Perot structure, or to alter the reflection or transmission color of a thin film structure. A porous primer may also be used to induce porosity in an interference layer which would normally not be permeable. In this instance, the primer may or may not contribute an optical effect depending on its index of refraction. Certain porous primer layers have been found to cause the metal layer not only to be permeable but to be more corrosion resistant. Adhesion between layers of a thin film structure also becomes greater when a porous primer is present. The surface area of attachment of adjacent thin film layers and between thin film layers and laminating adhesives of the solar control sheet assembly is greater when the structures are porous.

A porous primer may be deposited from a variety of different methods and formed from a variety of different materials. The preferred method of deposition is with vacuum processes similar to that used to deposit other thin films within the solar control thin film structure. These deposition processes are typically reactive thermal evaporation or direct current magnetron sputtering. The thermal processes are distinguished by their heat sources and are typically either reactive, electron beam evaporation or reactive, resistively heated evaporation. Maximum evaporant temperatures achievable with resistance heating are less than the temperatures which can be achieved with electron beam evaporation. Consequently, resistance evaporation techniques for producing the porous primer layer are limited to materials which can be evaporated by the temperatures achievable by means of resistance heating. Evaporatable compounds which can be deposited by resistance evaporation include oxides or other compounds of aluminum, silicon, zinc, indium, tin, tungsten, bismuth, antimony, cerium, magnesium molybdenum and barium. Oxide mixtures or oxide compounds containing more than one metal may also be effective in creating a porosity inducing surface.

Most porous primers are formed oxides from a reactive deposition process. Stoichiometric oxides or other compounds may also be referred to as fully oxidized or fully reacted compounds. A reactive deposition process is one where the reactive gas, oxygen in the case of oxides, is present in the vacuum chamber during the deposition process. The depositing atoms and molecules from the sputtering target plate or the heated evaporant source material undergo chemical oxidation as they are deposited and with increasing oxygen pressure, become increasingly porous.

Many types of vacuum deposition processes such as those described above and others, can be used to make a porous primer layer. Other types of nonvacuum porous primer layers are also possible. For example, sol gel coatings can be used to form a porous primer layer. Porous primer layers may also be obtainable through the use of water based polymer coatings. The polymer particle suspensions in water (often referred to as latex) emulsions may form the necessary porous primer structure the porosity of which can be regulated by coating at specific dilution levels which are known to those skilled in the art. Suitable polymers for this type of latex coating may include styrene butadiene, acrylic, and polyurethane. Porous primer layers may also be obtained from filled polymer coatings. Polymeric organic layers containing sufficient amounts of particle fillers are known to have porous structures.

Inorganic/organic composites may also be used to form the porous primer layers. Such coatings are coated as mixtures of inorganic and organic compounds or organic molecules with inorganic functionalities attached. The resulting coatings are chemical composite structures which may exhibit controllable porosity. Plasma deposited inorganic or organic coatings can also be used to form a porous primer layer. For example, porous oxides or other compounds may be deposited by passing an organometallic or silane chemical through an atmospheric or reduced pressure plasma. Partial disassociation of these molecules by the energetic plasma leaves them in a sufficiently reactive state that they will attach themselves to a substrate. It is known that the porosity of such coatings can be controlled depending on the deposition process parameters utilized.

The present invention is particularly suitable for making solar control films which are capable of functioning as heat mirrors ("heat mirror" is a registered trademark of Southwall Corp.). In particular, the invention can be used to make a solar control film which includes $TiO_2/Ag/TiO_2$ as a stack on a water permeable polyester substrate. In this embodiment the first layer of $TiO_2$ which is in contact with the substrate functions as a porous primer layer. In addition, this first $TiO_2$ layer has an optical function as part of the heat mirror stack. The silver layer is sputter coated on top of the first $TiO_2$ layer and the silver is rendered water permeable because of the porosity of the $TiO_2$ primer layer. The outer $TiO_2$ layer which is optically functional in the heat mirror stack ($TiO_2/Ag/TiO_2$) may be coated in the same way that the first $TiO_2$ layer is coated so that it is also porous. Thus, if an additional metal is coated on the exposed surface of the second or outer $TiO_2$ layer, then this outer layer will function as porous primer layer to cause the additional layer coating to be water permeable. All of the metal layers in this heat mirror solar control film are water permeable so that water vapor can pass therethrough.

The following examples illustrate specific embodiments of the invention which have been tested. Sputtered zirconium oxide is used to make a nichrome alloy layer porous in the structure having the layers polyester film/$ZrO_2$ (30 nm)/sputtered nichrome alloy. Silicon dioxide from a sol gel coating process is used in the structure having the layers: polyester film/sol gel $SiO_2$/nichrome alloy. Similarly, electron beam, vacuum evaporated titanium dioxide was used to make silver porous in the structure containing the layers: polyethylene terephthalate sheet/$TiO_2$/Ag/$TiO_2$.

The useful thickness of a porous primer layer covers a wide range and depends on the primer material and the material of the layers caused to be permeable. Porous primer layer thickness may be as low as 1 nanometer as has been found in the case of zinc oxide to several microns in the case of porous polymer coatings. If the porous primer has a secondary function such as an optical interference layer, the exact thickness would be determined by the optical function rather than its permeability function.

It is also possible to alter the surface of a polymer substrate to produce controlled porous surface topology capable of causing normally impermeable thin films to be permeable. Plasma or chemical etching of a polymer surface may be used to create the proper porous structure. Subsequently vacuum deposited layers will be porous when they are applied to the surface of a polymer substrate which has been sufficiently roughened in this manner. For example, chemically etched polycarbonate film causes a subsequently applied layer of sputtered gold to have the required water permeability. Preferably, the surface should be roughened so that material deposited thereon will have a columnar structure. Roughened surfaces which induce columnar growth are described in the publication "Effect of Substrate Roughness on the Columnar Growth of Cu Films" by P. Bai, J. F. McDonald and T. M. Lu, *J. Vac. Sci. Technol.* A 9(4), July/August 1991; the text of which is incorporated herein by reference.

Specific coating methods have been described herein as appropriate techniques for forming the porous primer layer. However, the porous primer layer which is formed or deposited on the substrate film does not have to be formed by such coating processes if the surface of the substrate layer can be modified so as to form a porous layer thereon. In other words, the porous primer layer on the substrate can be formed by simply subjecting the surface of the substrate to an etching procedure (e.g., chemical or plasma etching) to form an integral layer having the required porosity characteristic. For the purpose of the present invention, such a modified surface is considered as a porous primer coating or layer on the substrate. Thus, the porous primer coating may be an adherent layer deposited on the substrate by the methods heretofore described or alternatively the porous primer layer may be an integral porous layer formed by modifying the surface of the substrate. In either case the substrate has a porous surface topography so the subsequently deposited thin film layer is rendered water permeable.

The solar control sheets of the present invention may be semi-transparent, spectrally selective or even opaque. A semi-transparent sheet allows only a portion of the light to pass therethrough. A spectrally selective sheet will substantially prevent passage of a particular wavelength or range of wavelengths and will alloy other wavelengths to pass through the sheet. Typically, such spectrally selective sheets will allow passage of the visible light but not allow passage of the infrared and/or ultra-violet light. Opaque sheets substantially block the passage of visible light as well as infrared and ultra-violet light.

BRIEF DESCRIPTION OF THE DRAWINGS

FIG. 7 shows the addition of a second metal/dielectric thin film pair which gives the sheet greater spectral selectivity.

DETAILED DESCRIPTION OF THE PREFERRED EMBODIMENTS

This porous primer invention applies to any thin film coating or substrate surface topology within a flexible solar control sheet assembly that causes optical thin film layers to be water permeable that would otherwise be impermeable. The increased water permeability the porous primer causes in the solar control sheet must be sufficient to raise the water vapor transmission rate of the solar control sheet to at least 2 grams/square meter/day. At this level of permeability or higher, the solar control sheet is considered fast drying and problems of clouding, corrosion, and adhesive distortion are eliminated or reduced. Layers within the thin film structure requiring improved permeability may be metals, metal alloys, metal oxides, or other chemical compounds in thin film form or combinations of any of these layers. A porous primer may cause one or more of these normally non-permeable layers to be permeable. In some multilayer thin film structures, more than one porous primer layer may be required to cause the entire thin film structure to be permeable.

Figure 1:
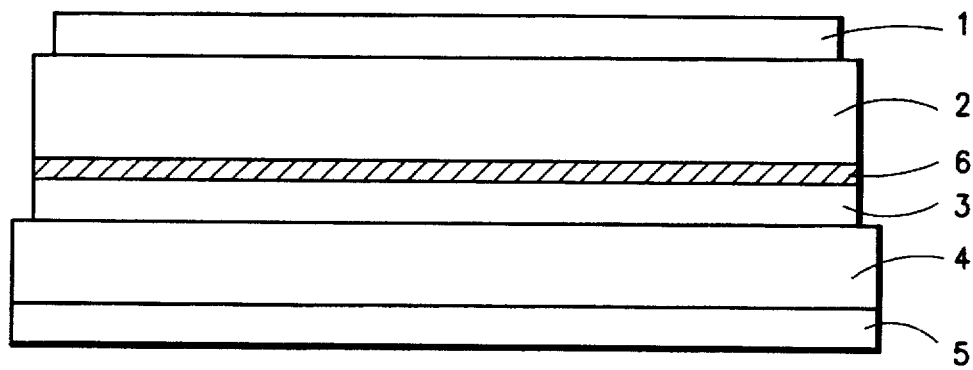
FIG. 1 depicts the sequence of layers found in conventional prior art solar control film.

A typical prior art solar control sheet assembly containing thin film layers is shown in FIG. 1 with the layer configuration as follows:

Layer 1.—One micron thick acrylic polymer abrasion resistance layer applied by solvent coating.

Layer 2.—Twenty three micron thick polyethylene terephthalate sheet which serves as a substrate for the thin film layers.

Layer 6.—Vacuum deposited thin film layers which in the simplest solar control sheet assemblies typically consists of one transparent layer of nickel alloy or aluminum. More complex multilayer thin film structures may be used to achieve particular spectral characteristics in a solar control sheet.

Layer 3.—Polymeric adhesive which adheres layers 1, 2, and 6 to layers 4 and 5.

Layer 4.—Twelve micron thick polyethylene terephthalate sheet containing compounds to absorb ultraviolet light at wavelengths from 320 nanometers to 380 nanometers.

Layer 5.—Polymeric adhesive used to attach the solar control sheet assembly to the surface of a rigid glazing material which is usually glass.

The reference numerals 1–6 identified above for FIG. 1 are used to identify corresponding layers in FIGS. 2–7.

Figure 2:
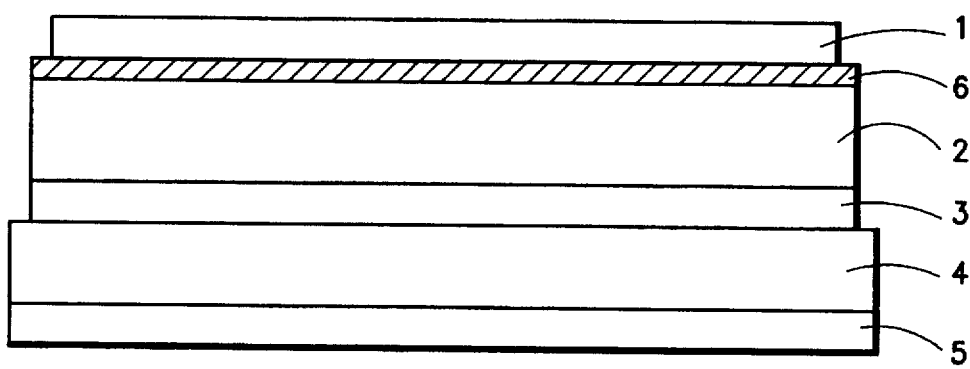
FIG. 2 depicts the sequence of layers found in an alternative embodiment of a conventional prior art solar control film which provides a lower emissivity surface.

FIG. 2 shows a solar control sheet modified to increase the thermal infrared reflectivity (lower emissivity) of one surface of the sheet. To increase the reflectivity at the thermal wavelengths of 8 to 12 microns, the layer 6 is an infrared reflecting metal layer which is positioned between layers 1 and 2. The polyethylene terephthalate polymer of layer 2 is absorbing at the wavelengths of 8 to 12 microns which absorbs the infrared energy before it reaches the metal layer 6. The modified solar control assembly of FIG. 2 positions the metal layer to a location within the assembly where its infrared reflective qualities are not blocked by a polyethylene terephthalate polymer sheet. The acrylic polymer of layer 1 is also absorbing in the thermal infrared, but if limited to a thickness of 1 micron or less the infrared absorption is sufficiently minimized. The acrylic polymer layer 1 may be replaced by thermal infrared transparent polymers such as polyethylene or polypropylene described in U.S. Pat. No. 4,226,910, the specification of which is included herein by reference. In the configuration of FIG. 2, layer 6 usually consists of an infrared reflecting metal such as aluminum or a multilayer thin film structure containing silver, copper, or gold.

Preferred embodiments of this invention include the following examples.

EXAMPLE 1

Figure 3:
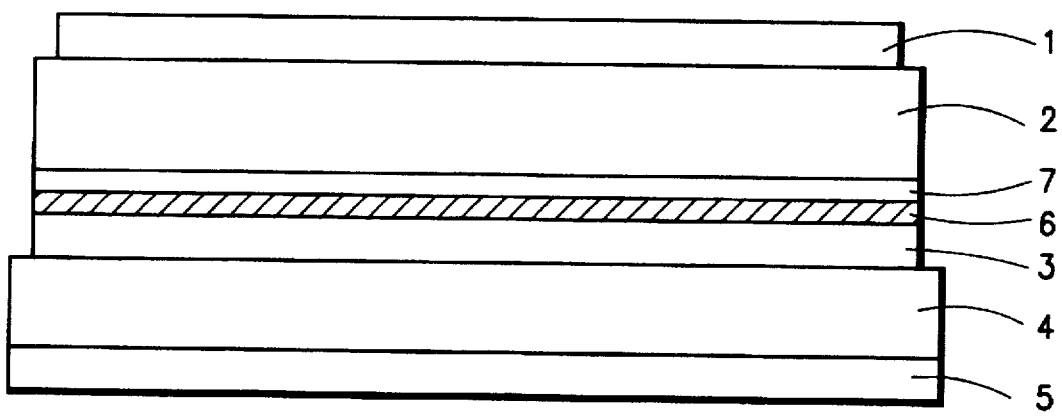
FIG. 3 shows the cross-sectional layers found in a stack of layers of the present invention in its simplest embodiment.
Figure 9:
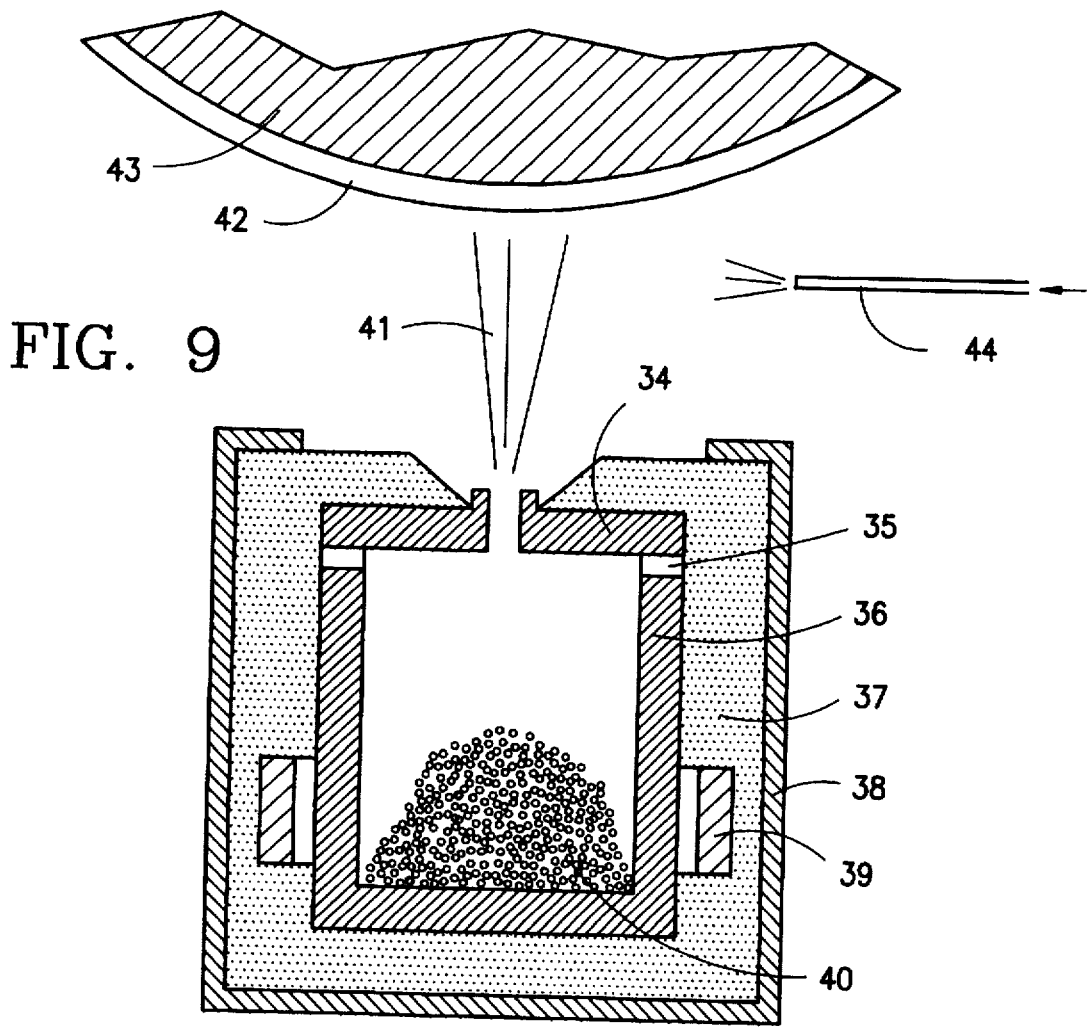
FIG. 9 shows schematically a cross section drawing of a resistively heated, box evaporation, deposition source.

In the simplest embodiment of this invention the porous primer layer would have the sole function to cause one subsequently deposited thin film layer to become water permeable. A common version of a prior art solar control sheet used in both automotive and architectural applications as depicted in FIG. 1 is with one 15 nanometer metal layer 6 deposited on polymer layer 2 wherein the metal layer is Hastelloy C-276 which is chosen for its visually appealing neutral transmission and reflectance color as well as corrosion resistance. The nickel alloy is deposited by direct current magnetron sputtering with 2 microns of mercury argon background pressure. When the solar control sheet is fully assembled as shown in FIG. 1, its visual light transmission is 30%. Water permeability of the prior art solar control sheet product shown in FIG. 1 is not sufficient for the sheet to be considered fast drying. To make the sheet fast drying, a porous primer shown as layer 7 in FIG. 3 consisting of porous SiO$_2$ is deposited on polymer layer 2 prior to the nickel alloy shown as layer 6. When the nickel alloy is subsequently deposited on the porous SiO$_2$, the nickel alloy is caused to have increased water permeability. The porous SiO$_2$ is deposited from a conventional resistively heated graphite box evaporation source as shown in FIG. 9. The source material in the graphite box is SiO and is heated to 1150° C. to 1250° C. The vapor is deposited as porous SiO$_2$ by adding oxygen as a background gas in the vacuum chamber during the deposition process. The oxygen partial pressure in the deposition chamber is maintained at 8 microns of mercury. A porous SiO$_2$ thickness of 30 nanometers is sufficient to cause the nickel alloy to be permeable. This polyethylene terephthalate sheet with its thin film coatings is then transferred to solvent coating and lamination processes where the full solar control sheet assembly as shown in FIG. 3 is completed.

EXAMPLE 2

Solar control sheets containing nickel alloy layers with visible light transmission levels of 30% have visible light reflectance levels greater than 20%. Reflectance levels greater than 20%, especially on the interior side of a window, are undesirable in some retro-fit solar control markets. The SiO$_2$ porous primer layer described in example 1 may serve a dual use if the thickness of the SiO$_2$ is such that it functions as an optical interference, antireflection layer as well as a primer causing the subsequent layer of nickel alloy to become water permeable. If the SiO$_2$ is between 70 and 200 nanometers thick, preferably about 110 nanometers, it will reduce the visible wavelength reflectance of the nickel alloy on the SiO$_2$ side. Reduced reflectance levels on one side of a solar control sheet between 5% and 20%, which this antireflection layer provides, are often desirable in the solar control sheet market.

EXAMPLE 3

The same two layer structure described in example 2 and depicted in FIG. 3 may be modified into a more spectrally selective, infrared reflecting coating by substituting the nickel alloy with silver. SnO$_2$ deposited from a resistively heated box evaporation source is the preferred porous primer for silver, copper, gold, and their alloys. To deposit this primer layer, SnO$_2$ source material is placed in the graphite box and thermally evaporated. When the SnO$_2$ is heated to temperatures of 1150° to 1250° Centigrade, the compound partially dissociates and some of the released oxygen is pumped away by the vacuum chamber's pumping system. To compensate for the lost oxygen, oxygen is added as a background gas during the deposition process. To form a layer of SnO$_2$ with the proper structure for it to function as a porous primer for a subsequent infrared reflecting metal layer, the background oxygen pressure is maintained at 5 microns of mercury. SnO$_2$ deposited with oxygen background pressures below 5 microns tends to be optically absorbing and does not cause subsequently deposited metal layers to be water permeable. SnO$_2$ deposited with background oxygen pressures above 5 microns tends to form a powdery coating with poor adherence to the polyethylene terephthalate substrate. The SnO$_2$ primer layer is 30 nanometers thick to cause the subsequent infrared reflecting metal to be water permeable. The subsequent metal layer is deposited by direct current magnetron sputtering and may be from 5 nanometers to 40 nanometers thick depending on the optical charateristics desired in the solar control sheet.

EXAMPLE 4

An alternative primer layer which may be used to cause an infrared reflecting metal to become water permeable when the metal is sputter deposited over the primer is zinc oxide. When ZnO is used as the primer layer subsequent to the deposition of the infrared reflecting metal layer, it is deposited by reactive, direct current, magnetron sputtering. In this process the pure zinc metal is the magnetron cathode material and the sputtering background gas consists of a mixture of argon and oxygen. As the sputtering of zinc is carried out, the degree of oxidation of the depositing film of zinc oxide is controlled by the oxygen to argon gas ratio. In conventional ZnO sputtering, as is used in the glass coating industry for coating multilayer, low emissivity glass coatings, the oxygen level is typically raised no further than to deposit nonabsorbing, stoichiometric ZnO. It is normally undesirable to raise the oxygen level higher since it causes the ZnO to become more porous and the deposition rate decreases. For the purposes of this invention where the ZnO is used to cause subsequently deposit layers to be porous, the oxygen to argon ratio is intentionally raised 50% higher than is necessary to achieve stoichiometric ZnO. The ZnO primer is 3 nanometers thick to cause subsequent layers to be water permeable.

EXAMPLE 5

Figure 6:
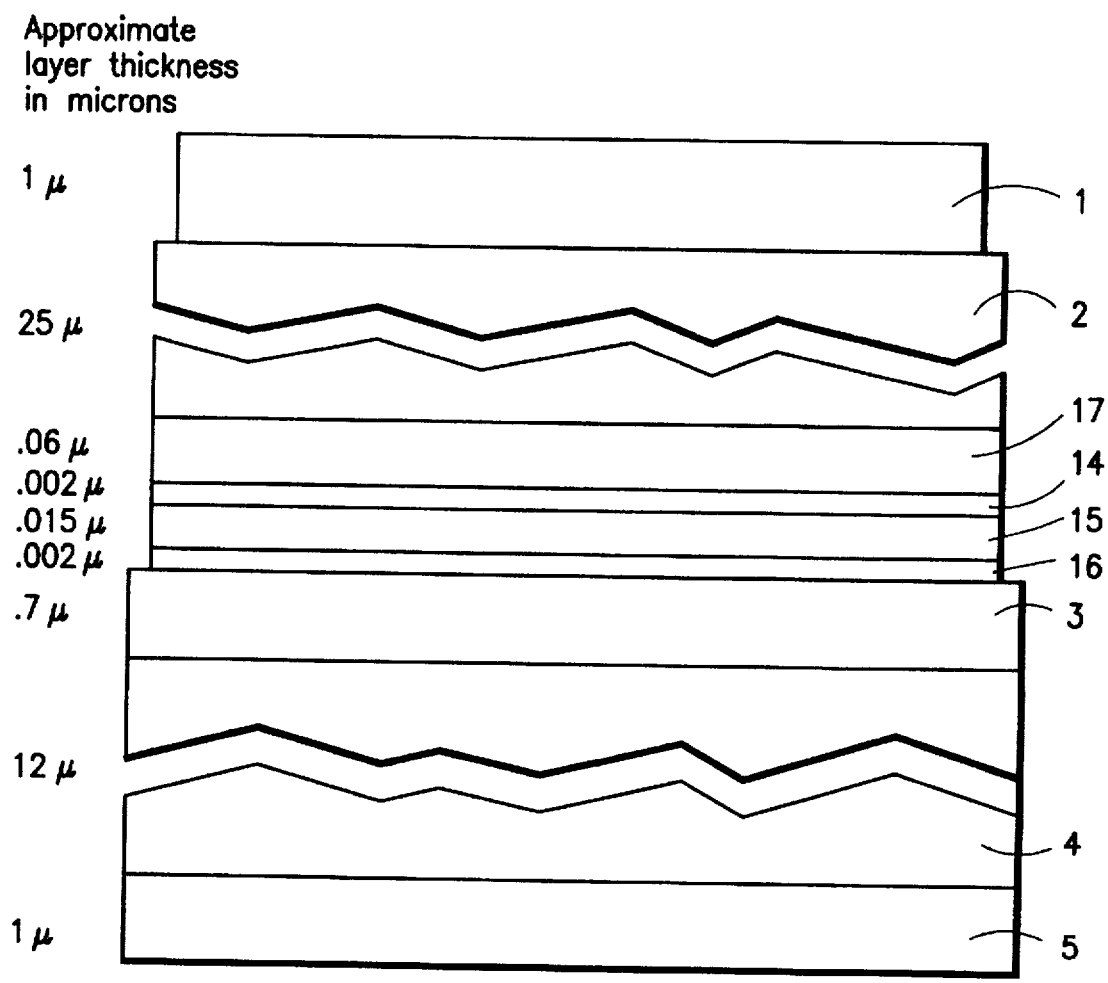
FIG. 6 illustrates an embodiment of the invention with an infrared reflecting metal surrounded by thin protective layers.

Very thin protective layers may be added to one or both sides of an infrared reflecting metal to improve color, appearance or corrosion resistance. In FIG. 6, the infrared metal is shown by layer 15 and the protective layers on either side of it by layers 14 and 16. The practice of using thin protective layers is common on transparent layers of silver and copper which are prone to corrosion when contained in a solar control sheet. These protective layers may be as thin as a few atomic layers and usually do not exceed 4 nanometers thick. They may be chosen from many different materials. Nickel, chromium, molybdenum, palladium, gold, titanium, zirconium or alloys of these metals are typical choices. Metal oxides, nitrides, carbides or other thin film compounds are also used as protective layers. Infrared reflecting metals with protective layers generally are not water permeable and use of porous primers is the only way of achieving permeability in magnetron sputtered layers of these metals. The thin film structure shown in FIG. 6 is formed by sequential deposition of the four thin film layers. The primer layer of SnO$_2$ is deposited from a graphite box evaporation source with a source metal of SnO$_2$ heated to its vaporization temperature of 1150° to 1250° Centigrade. A background pressure of oxygen is maintained at 5 microns of mercury. The SnO$_2$ primer layer, layer 17, is coated to a thickness of 60 nanometers and serves the additional optical function of antireflecting the metal layers on the interior side of the solar control sheet. The first protective layer is nickel deposited by direct current magnetron sputtering to a thickness of 2 nanometers. The infrared metal, consisting of silver is sputter deposited to a thickness of 20 nanometers. Finally the second protective layer is deposited similarly to the first protective layer. The SnO$_2$ primer layer induces water permeability and reduces visible light reflection on one side of all three metal layers.

EXAMPLE 6

Figure 4:
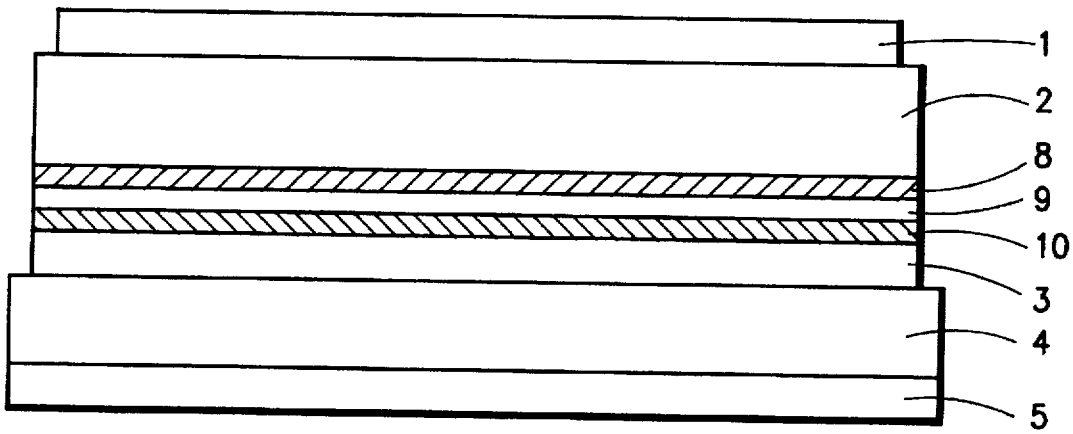
FIG. 4 illustrates an alternative embodiment of a stack of layers made in accordance with the present invention with reduced reflection and neutral color transmission.

FIG. 4 shows a solar control sheet typically used for automotive applications with a Fabry-Perot type 3 layer thin film structure of metal/dielectric/metal. Hastelloy C-276 is used as the two metal layers and SiO$_2$ as the center dielectric, and this structure provides a neutral, visible, transmission color with reflectance levels on both sides of the solar control sheet of about 7%. Reflectance levels created by this three layer structure for a given transmission level are lower than if a single metal layer of nickel alloy is used. Glazing reflectance below levels of less than 10%, which this design provides, are desirable for automotive applications in the solar control industry. In this embodiment, each nickel alloy layer which may consist of Inconel 600 or Hastelloy C-276 as shown in FIG. 4 by layer 8 and layer 10 may range in thickness from 2 nanometers to 15 nanometers. The optical transmission desired in the solar control sheet dictates the thicknesses used. The optical interference layer between the two metal layers as shown by layer 9 in FIG. 4 in this embodiment is porous SiO$_2$ and is 120 nanometers thick.

If no technology is used to induce porosity in this 3 layer thin film structure, resulting water permeability of the solar control sheet is too low for the sheet to dry rapidly. When the porous primer technology of this invention is applied, the water permeability of the solar control sheet may be raised almost to the level of a solar control sheet incorporating no thin film layers. In this three layer thin film structure, the porous $SiO_2$ layer is deposited under conditions so that it causes the subsequently deposited metal layer 10 to become water permeable even though it is deposited under conditions which normally would not cause it to be permeable. Metal layer 8 in FIG. 4 is made permeable by sputtering it in an argon background gas pressure of 40 microns.

EXAMPLE 7

Figure 5:
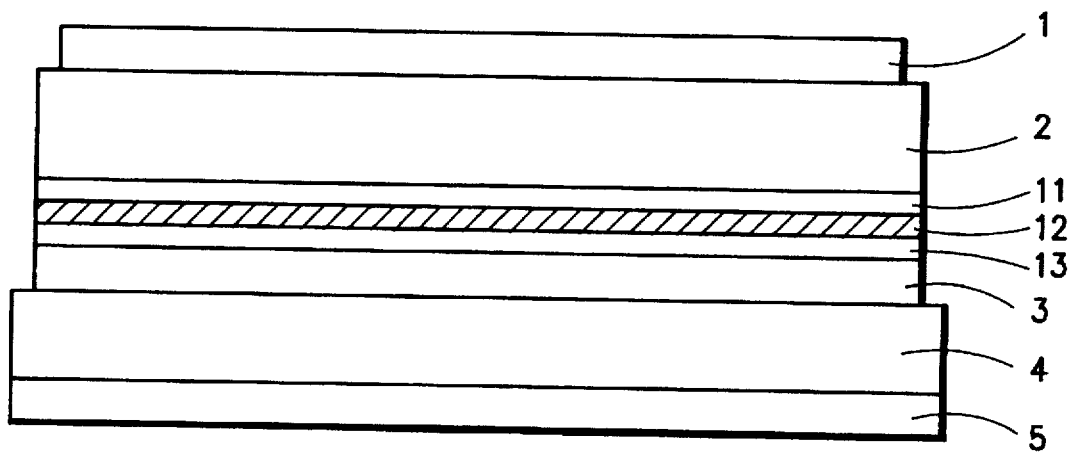
FIG. 5 illustrates an embodiment of the invention with high visible light transmission and high infrared reflection.

It is often desirable in the field of solar control for a glazing to have the optical properties of high visible light transmission and high infrared reflectance; both being in the range of 60% to 90%. Thin film layers which may be used to accomplish this spectral selectivity are shown in FIG. 5. Layer 11 is a nonabsorbing dielectric which antireflects metal layer 12. Layer 13, like layer 11, is also a nonabsorbing dielectric. Layer 13 functions to antireflect the metal on the opposite side. The metal layer 12 is usually silver, silver alloy or a silver layer with very thin metal protective layers on one or both sides of the silver metal. The latter two versions of metal layer 12, silver alloy and protected silver metal, are modifications to reduce corrosion of the silver. The metal layer 12 may also consist of other heat reflecting metals such as Cu, Au, Ni, or Al or their alloys. Conventional versions of layers 11 and 13 are typically reactively magnetron sputtered or thermally evaporated oxides of metals Ce, Sn, In, Zn, Ti, Nb, Mo, Ta, W or combinations of these oxides. Conventional versions of this heat reflecting thin film structure are usually insufficiently permeable to allow a solar control sheet to be fast drying. The silver layer within conventional versions of this thin film structure is particularly impermeable to water. Unlike Inconel 600 and Hastelloy C 276, silver and copper thin films which are the most useful of the heat reflecting metals cannot be made permeable by sputtering with a background argon pressure of 40 to 60 microns of mercury.

Figure 7:
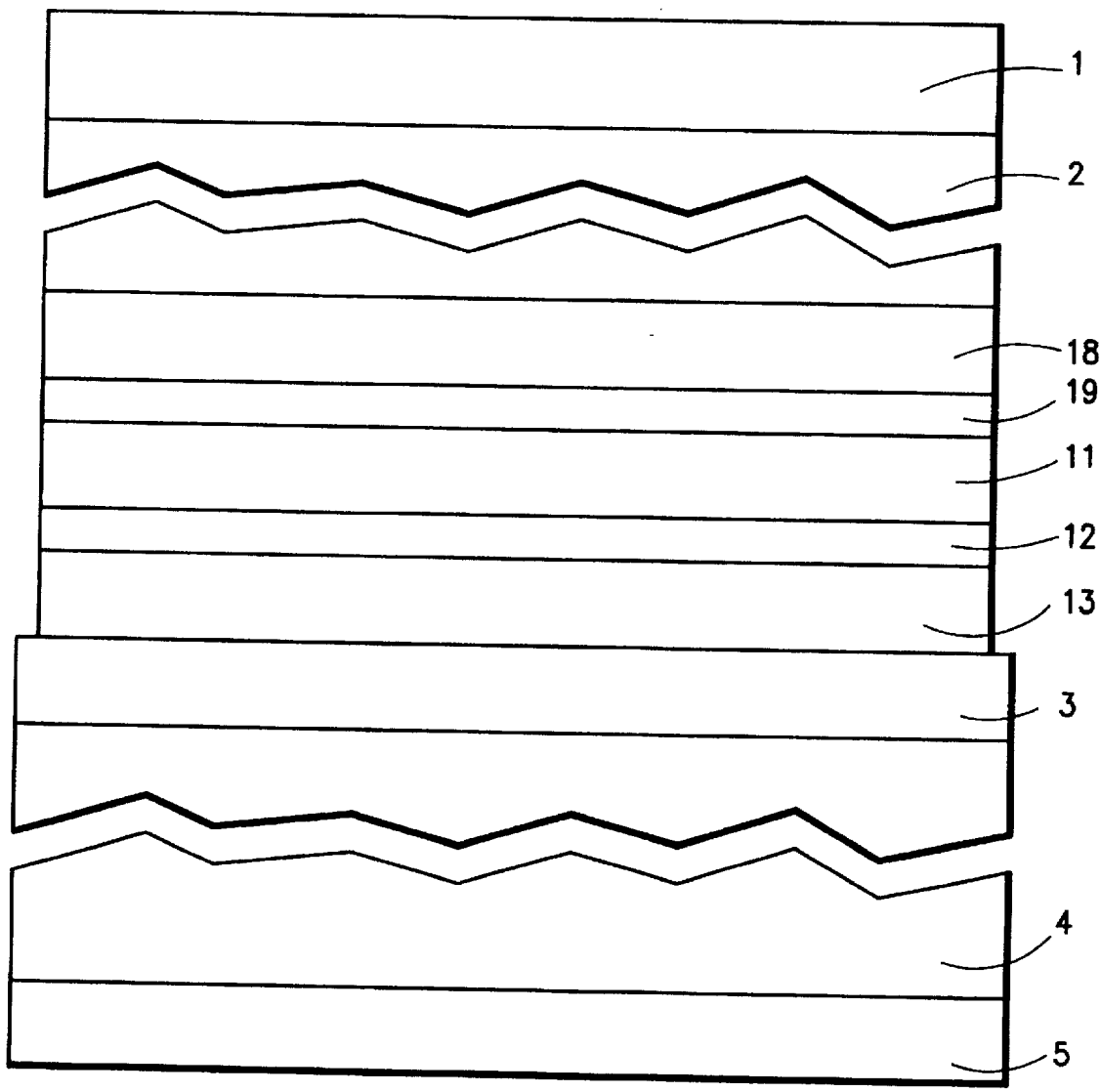
FIG. 7 illustrates an embodiment of this invention which is a modified version of the sheet shown in FIG. 5.
Figure 8:
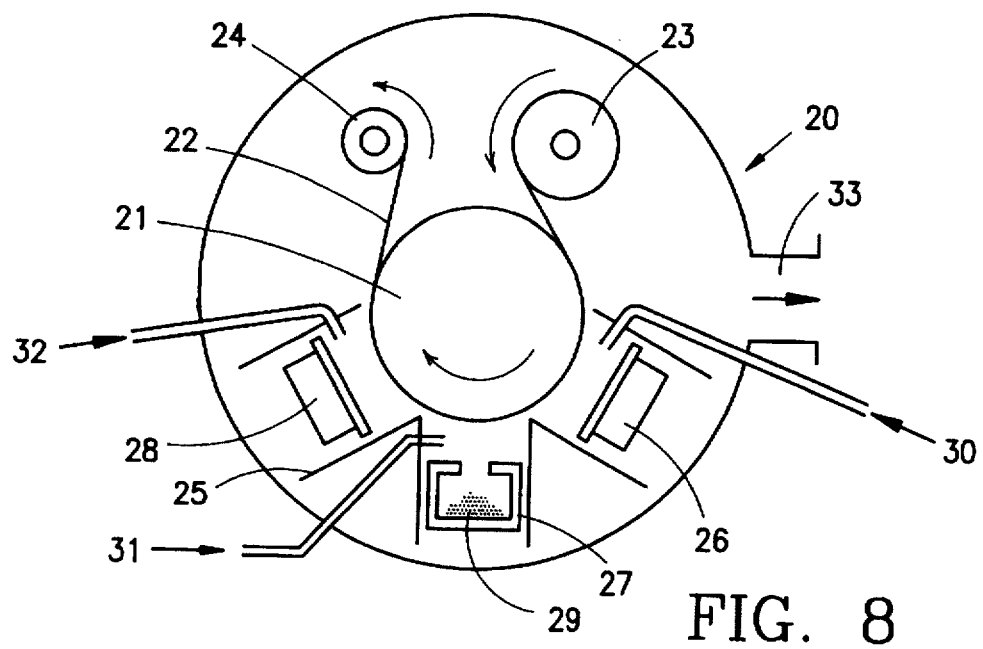
FIG. 8 shows schematically a vacuum roll coating apparatus with three deposition subchambers.

The heat reflecting thin film structure shown in FIG. 7 may be modified in accordance with this invention to produce a water permeable solar control sheet. In accordance with this invention, the first dielectric layer 11 coated onto polymer layer 2 is a porous layer of evaporated $SnO_2$ which functions as a porous primer and optical interference layer. Maximum permeability can be obtained if the second $SnO_2$ dielectric layer 13 is also deposited to be porous, although, this may not be necessary to make the solar control sheet fast drying.

This $SnO_2$ primer used in the heat reflecting thin film structure shown in FIG. 7 is 60 nanometers thick and is deposited by thermal evaporation of $SnO_2$ from a resistively heated graphite box evaporation source. $SnO_2$ is the source material placed in the box and thermally evaporated. When the $SnO_2$ is heated to evaporation temperatures of 1150° C., the compound partially dissociates and some of the released oxygen is pumped away by the vacuum chamber's pumping system. To compensate for the lost oxygen, oxygen is added as a background gas during the deposition process. To form a layer of $SnO_2$ with the proper structure for it to function as a porous primer for subsequent silver layers, the oxygen pressure is maintained at 5 microns of mercury. $SnO_2$ deposited with oxygen background pressures below 5 microns tends to be optically absorbing and insufficiently porous to function as a porous primer layer. $SnO_2$ deposited with background oxygen pressures above 5 microns tend to be powdery and poorly attached to the substrate. The infrared reflecting metal layers are deposited by direct current magnetron sputtering and may be from 5 nanometers to 30 nanometers thick depending on the optical characteristics desired in the solar control sheet. The heat reflecting metal layer 12 is deposited by direct current magnetron sputtering. The thickness is 12 nanometers. Layer 13 is evaporated $SnO_2$ deposited by the same process as layer 11 to a thickness of 60 nanometers.

More layer pairs of metal/dielectric may be added over layer 13 of this thin film structure to increase the spectral selectivity. Where these additional layers are added, each dielectric deposited prior to a metal must be of a porous primer in accordance with this invention for the solar control sheet to be fast drying. FIG. 7 shows a solar control sheet assembly containing a five layer spectrally selective thin film structure. Layers 11, 12, and 13 in FIG. 7 are the same as shown in FIG. 5. Layer 19 in FIG. 7 is an additional layer of sputtered infrared reflecting metal and layer 18 is an additional layer of evaporated $SnO_2$.

EXAMPLE 8

Silver/porous quarter wave thickness spacer layer/copper (this is a Fabry-Perot structure that produces a good quality solar control sheet due to its spectral selectivity). The quarter wave thickness optical spacer is resistively evaporated and may be clear or slightly absorbing. The preferred spacer material is evaporated $SnO_2$. The center layer in this embodiment functions as a porous primer to the second metal and also functions as an optical interference layer. The layer structure in this design is the same basic metal/dielectric/metal design as depicted in FIG. 4. Design variations for this embodiment include:

porous primer/silver/optical spacer/copper (for porosity in the first metal layer);

protective layer/silver/optical spacer/copper/protective metal (for corrosion protection); and silver/optical spacer/copper/optical spacer/silver (an extra oxide/metal pair for enhanced spectral selectivity). A porous primer layer formed of $WO_3$ may be formed by the same procedure used to form a porous primer layer of $SnO_2$.

The term "oxide" is meant to include a single oxide as well as a mixture or combination of oxides. Thus a primer layer which comprises an oxide includes primer layers made from a single oxide or a mixture of oxides.

The term "metal" which is not qualified as a "metal compound" or "metal oxide" means that the metal is in the elemental state and includes alloys of metals.

While the present invention has been described in terms of certain preferred embodiments, one skilled in the art will readily appreciate that various modifications, changes, omissions and substitutions may be made without departing from the spirit thereof. It is intended, therefore, that the present invention be limited solely by the scope of the following claims.

What is claimed is:

1. A method for making a water vapor transmissible solar control sheet of the type which comprises a water vapor transmissible film with a light affecting coating thereon; said light affecting coating including a metal layer or a metal compound layer; wherein said method comprises forming a porous primer layer on a water vapor transmissible film, said porous primer layer having pores greater than 1 nm up to 100 nm in diameter whereby said porous primer layer has a porosity inducing surface on an exposed surface thereof and said porous primer layer being formed by thermally evaporating a compound under a vacuum and depositing said evaporated compound on said water vapor transmissible film and then depositing a metal or metal compound coating on said porosity inducing surface of said porous primer layer to induce the porosity of said coating as said coating is deposited on said porosity inducing surface of said porous primer layer whereby said coating is rendered porous for the transmission of water vapor therethrough.

2. The method of claim 1 wherein the primer layer has a thickness of about 2 nm to 200 nm.

3. The method of claim 2 wherein the primer layer has a thickness of about 10 nm to 200 nm.

4. The method of claim 3 wherein the porous primer layer comprises oxide.

5. The method of claim 4 wherein said metal oxide is selected from the group consisting of tin oxide, silicon dioxide, zinc oxide, tungsten oxide, indium oxide, bismuth oxide, magnesium oxide, antimony oxide, and aluminum oxide.

6. The method of claim 5 wherein said oxide is selected from the group consisting of tin oxide, silicon dioxide, indium oxide, and zinc oxide.

7. The method of claim 3 wherein the evaporation is reactive evaporation.

8. The method of claim 3 wherein the solar control sheet formed by said method has a water vapor transmission rate of at least 2 gm/sq. m./day.

9. The method of claim 1 wherein said porous primer layer has an optical interference property whereby said porous primer layer functions as an optical interference layer as well as a layer which contains a porosity inducing surface.

10. The method of claim 9 which includes forming a stack on said metal or metal compound coating; said stack comprising a combination of at least one additional porous primer layer and at least one additional metal or a metal compound layer wherein said at least one additional primer layer has pores greater than 1 nm in diameter up to 100 nm in diameter whereby said at least one additional porous primer layer has a porosity inducing surface to induce porosity in said at least one metal or metal compound layers in said stack.

11. The method of claim 10 wherein said stack forms a multi-layer optical coating which includes a dielectric porosity inducing layer, a porous dielectric layer rendered porous by said dielectric porosity inducing layer and a porous metal or porous metal compound layer.

12. The method of claim 1 wherein said metal or metal compound deposited on said porosity inducing surface of said porous primer layer has pores which are 1 nm–100 nm in diameter.

13. The method of claim 1 wherein metal is deposited on said porosity inducing surface so that said coating which is rendered porous is metal.

14. The method of claim 13 wherein the metal is selected from the group consisting of silver, copper, gold and alloys thereof and said metal coating is applied to achieve a coating thickness of about 5 nm to about 40 nm.

15. The method of claim 14 wherein the metal is an alloy containing at least 50% by weight of Ag, Cu or Au.

16. The method of claim 14 wherein the metal coating which has been rendered porous is silver or an alloy thereof whereby said silver or silver alloy has a porosity inducing surface for inducing porosity in a subsequently applied coating and said method further includes sequentially depositing additional metal or metal compound coatings onto said silver or silver alloy coating to form a stack of elemental metal or metal compound coatings on said silver or silver alloy coating and wherein each sequentially applied coating is rendered porous with a porosity inducing surface whereby each porosity inducing surface induces porosity in the next sequentially applied coating so that the stack is porous for the transmission of water vapor therethrough.

17. The method of claim 13 wherein said metal is selected from the group consisting of titanium, chromium, Iron nickel alloy, niobium, molybdenum, and alloys thereof.

18. The method of claim 13 wherein said metal is selected from the group consisting of stainless steel and nickel alloy.

19. The method of claim 1 wherein said metal or metal compound coating deposited on said porosity inducing surface is formed by depositing a first coating on said porosity inducing surface and then depositing a second coating on said first coating wherein said first coating is selected from the group consisting of metal, metal alloy, metal compound and combination of metal and metal compound and said second coating is a metal or metal alloy, with the proviso that said first and second coatings are different.

20. The method of claim 19 which further includes depositing a third coating on said second coating; said third coating selected from the group consisting of metal, metal alloy, metal compound and combination of metal and metal compound, with the proviso that said second and third coatings are different.

21. The method of claim 20 wherein the second layer is silver and the first and third layers are metal or metal alloy.

22. The method of claim 1 wherein the metal or metal compound coating deposited on said porosity inducing surface is formed by depositing a first coating on said porosity inducing surface and then depositing a second coating on said first coating wherein said first coating is a metal or metal alloy and said second coating is selected from the group consisting of metal, metal alloy, metal compound or combination of metal and metal compound, with the proviso that said first and second coatings are different.

23. The method of claim 1 wherein said water vapor transmissible film upon which the porous primer layer is deposited, consists of polymer.

24. The method of claim 1 wherein said water vapor transmissible film, said porous primer layer and said metal or metal compound coating are selected to be semi-transparent so as to allow only a portion of the light to pass therethrough or spectrally selective to prevent passage of a particular wavelength or range of wavelengths therethrough while allowing other wavelengths to pass therethrough.

* * * * *